United States Patent [19]

Taneya et al.

[11] Patent Number: 4,817,104
[45] Date of Patent: Mar. 28, 1989

[54] SEMICONDUCTOR LASER ARRAY DEVICE

[75] Inventors: Mototaka Taneya, Tenri; Seiki Yano, Kashihara; Sadayoshi Matsui; Mitsuhiro Matsumoto, both of Tenri, all of Japan

[73] Assignee: Sharp Kabushiki Kaisha, Osaka, Japan

[21] Appl. No.: 795,525

[22] Filed: Nov. 6, 1985

[30] Foreign Application Priority Data

Nov. 7, 1984 [JP] Japan ................. 59-235619

[51] Int. Cl.⁴ .................... H01S 3/19; H01S 3/08
[52] U.S. Cl. ................................. 372/50; 372/46; 372/48; 372/96
[58] Field of Search .................... 372/46, 48, 96, 50

[56] References Cited

U.S. PATENT DOCUMENTS

| | | | |
|---|---|---|---|
| 4,045,749 | 8/1977 | Burnham et al. | 372/50 |
| 4,257,011 | 3/1981 | Nakamura et al. | 372/96 |
| 4,309,667 | 1/1982 | DiForte et al. | 372/50 |
| 4,318,058 | 3/1982 | Mito et al. | 372/50 |
| 4,464,762 | 8/1984 | Furuya | 372/50 |
| 4,534,033 | 8/1985 | Nishizawa et al. | 372/50 |
| 4,594,719 | 6/1986 | Ackley | 372/48 |
| 4,622,674 | 11/1986 | Mito | 372/96 |
| 4,624,000 | 11/1986 | Streifer et al. | 372/50 |

FOREIGN PATENT DOCUMENTS

| | | |
|---|---|---|
| 0154517 | 2/1985 | European Pat. Off. |
| 0161924 | 5/1985 | European Pat. Off. |
| 0206496 | 5/1986 | European Pat. Off. |
| 2447536 | 10/1974 | Fed. Rep. of Germany |
| 2925648 | 6/1979 | Fed. Rep. of Germany |
| 60-42887 | 3/1985 | Japan ................. 372/50 |
| 2164206 | 9/1986 | United Kingdom |

OTHER PUBLICATIONS

Katz et al., "Diffraction Coupled ...", *Appl. Phys. Lett.*, 1983, vol. 42, No. 7, pp. 554-556.

Scifres et al., "Lateral Beam Collimation ...", *Appl. Phys. Lett.*, 1982, vol. 41, No. 7, pp. 614-616.

RCA Technical Notes No: 760, Apr. 1968, Integrated Phase Coherent Laser Array by Jacques I. Pankove.

Applied Physics Letter, Jul. 15, 1982, pp. 118-119, High Power Coupled Multiple Stripe Quantum Well Injection Lasers, by Scitres et al.

Electronics, Oct. 20, 1981, pp. 42-43, Laser Phased Arrays Shine From A Chip, by Larry Waller and Roderic Beresford.

*Primary Examiner*—Eugene R. LaRoche
*Assistant Examiner*—Michael Shingleton
*Attorney, Agent, or Firm*—Birch, Stewart, Kolasch & Birch

[57] ABSTRACT

A semiconductor laser array device comprising a structure for minimizing the dependence of the longitudinal mode of laser oscillation upon the driving electric current, thereby facilitating laser light oscillation at a high output power with a zero degrees phase shift between adjacent lasing elements.

14 Claims, 3 Drawing Sheets

PRIOR ART

SEMICONDUCTOR LASER ARRAY DEVICE

BACKGROUND OF THE INVENTION

1. Field of the Invention

This invention relates to a semiconductor laser array device having a plurality of striped channels.

2. Description of the Prior Art

Semiconductor laser devices which are useful as light sources for optical discs, optical information processing systems, etc., are required to produce high output power. However, conventional semiconductor laser devices having a single-lasing filament structure can only produce as low as several tens of mW output power.

In order to produce high output power, semiconductor laser array devices, in which a plurality of semiconductor laser devices are disposed in a parallel manner to achieve an optical phase coupling between the adjacent lasing filaments, have been proposed. However, these semiconductor laser array devices cannot attan a 0°-phase shift between the adjacent lasing filaments in the range of a high output power level.

Experimental data of the inventors indicate that although a Fabry-Perot semiconductor laser array device having three striped channels as lasing filaments attains a 0°-phase shift between the adjacent lasing filaments up to a 20 mW output power as shown in FIG. 3, it cannot attain a 0°-phase shift in a range of higher output power. FIG. 4 indicates that the longitudinal mode of this Fabry-Pérot semiconductor laser array device in the range of higher than a 20 mW output power is composed of the main mode and two submodes at the shorter wavelength side of the main mode. The temperature of the center striped channel rises more than that of each of the two outer striped channels as the amount of injection electric current into the laser array device is increased. As the temperature of a semiconductor laser rises, in general, the width of the forbidden band therein becomes smaller and the wavelength of the laser light emitted therefrom becomes longer. Thus, it can be said that the abovementioned main mode indicates a laser light derived from the center striped channel, while the two submodes at the shorter wavelength side of the main mode indicate laser lights which are oscillated, respectively, from the outer striped channels without being synchronized with the laser light from the center striped channel.

SUMMARY OF THE INVENTION

The semiconductor laser array device of this invention which overcomes the above-discussed and numerous other disadvantages and deficiencies of the prior art, comprises a structure for minimizing the dependence of the longitudinal mode of laser oscillation upon the driving electric current, and for attaining laser oscillation with a 0°-phase shift there.

The structure for minimizing the dependence of the longitudinal mode of laser oscillation upon the driving electric current is, in a preferred embodiment, a distributed feedback structure, a distributed Bragg reflection structure or an internal reflection structure.

Thus, the invention described herein makes possible the objects of (1) providing a semiconductor laser array device, having plural striped channels, which attains laser oscillation with a 0°-phase shift between the adjacent striped channels by suppressing a variation in the longitudinal mode of laser oscillation even when the temperature of the laser array device rises as the amount of injection electric current is increased; and (2) providing a semiconductor laser array device which produces laser lights with a 0°-phase shift therebetween up to high output power since the said laser array device has a structure (e.g., a distributed feedback structure, a distributed Bragg reflection structure, an internal reflection structure, etc.) which minimizes the dependence of the longitudinal mode of laser oscillation upon driving electric current.

BRIEF DESCRIPTION OF THE DRAWINGS

This invention may be better understood and its numerous objects and advantages will become apparent to those skilled in the art by reference to the accompanying drawings as follows:

FIG. 2($b$) is a perspective view showing the semiconductor laser array device having the V-channels shown in FIG. 2($a$).

DESCRIPTION OF THE PREFERRED EMBODIMENTS

EXAMPLE 1

Figure 1:
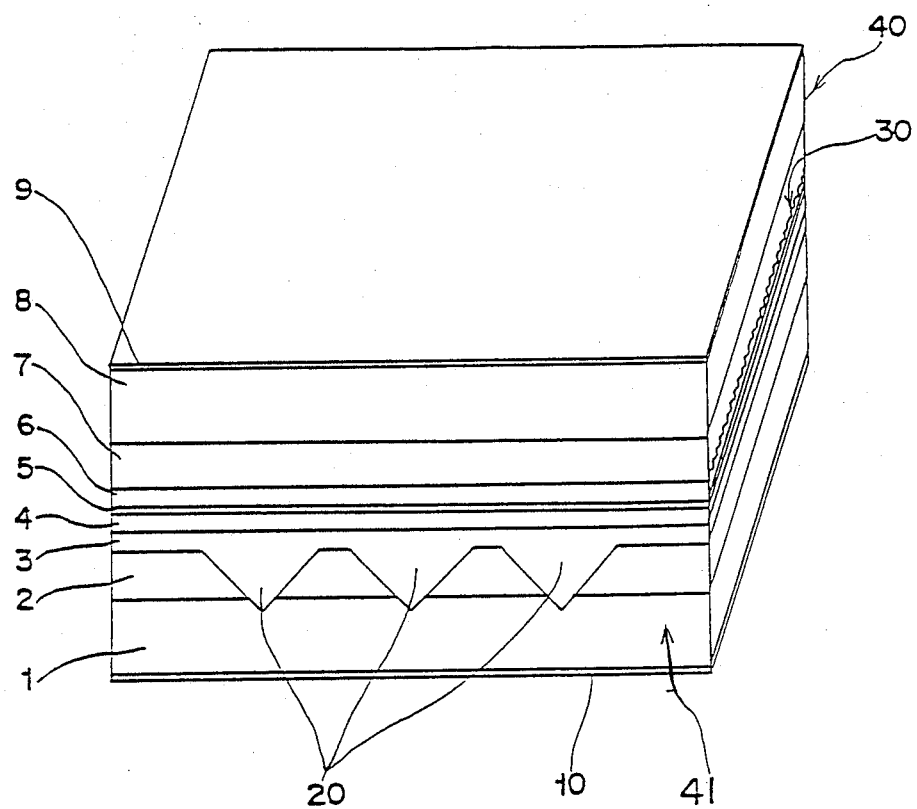
FIG. 1 is a perspective view showing a semiconductor laser array device of this invention.

FIG. 1 shows the distributed feedback semiconductor laser array device of this invention, which can be fabricated as follows: On a p$^+$-GaAs substrate 1, an n-GaAs current blocking layer 2 having a thickness of 1 μm is grown by a crystal growth technique such as liquid phase epitaxy, vapor phase epitaxy, metal organic-chemical vapor deposition, molecular beam epitaxy or the like. Then, a plurality of V-channels 20 having a depth of 1.1 μm and a width of approximately 4.0 μm are formed in a parallel manner with the center-to-center spacing of 5.0 μm at the current blocking layer side by photolithography and an etching technique in such a manner that they reach the substrate 1. Then, on the current blocking layer 2 including these V-channels 20, and p-Al$_x$Ga$_{1-x}$As cladding layer 3, a p-Al$_y$Ga$_{1-y}$As optical guiding layer 4, an n- or p-Al$_z$Ga$_{1-z}$As active layer 5 and an n-Al$_y$Ga$_{1-y}$As optical guiding layer 6 are successively grown by liquid phase epitaxy, vapor phase epitaxy, metal organic-chemical vapor deposition, molecular beam epitaxy or the like (wherein $x > y > z \geqq 0$). On the whole surface of the n- optical guiding layer 6, a grating 30 having the center-to-center spacing of approximately 325 nm and a depth of 0.1 μm is formed at right angles to the V-channels 20 by photolithography, using a photographic exposure with an optical interference system, and an etching technique. Then, on the optical guiding layer 6 having the grating 30, an n-Al$_x$Ga$_{1-x}$As cladding layer 7 and an n$^+$-GaAs contact layer 8 are grown by metal organic-chemical vapor deposition, molecular beam epitaxy or the like. Ohmic contacts 9 and 10 are then formed on the upper face of the grown layers and the back face of the substrate 1 of the resulting wafer, respectively, followed by the formation of rough faces 40 by an etching technique at the sides which are parallel to the V-channels 20 and the formation of facets 41 by cleavage at the other sides which are perpendicular to the V-channels 20, resulting in a semiconductor laser array device.

The rough faces 40 are not vertical to the substrate 1 although the cleavage facets 41 are vertical to the substrate 1. The rough faces 40 are not formed into a cleavage facet in order to suppress the effect of the Fabry-Pérot oscillation mode on the distributed feedback mode with which this invention is concerned. In order to attain the same purpose as mentioned above, a dielectric film is formed on each of the cleavage facets 41 by a sputtering technique using a high frequency, thereby minimizing the reflection index thereof.

In general, distributed feedback laser devices which have the structure of a single-striped channel hardly exhibit the dependence of oscillation wavelength on temperature (or electric current) as compared with Fabry-Pérot laser devices. In the same manner, the distributed feedback laser array device of this example hardly exhibits the dependence of oscillation wavelength on temperature (or electric current) as compared with a conventional Fabry-Pérot laser array device. This is because even when a difference in temperature between the center striped channel and the outer striped channels arises, the oscillation wavelengths at the striped channels of the distributed feedback laser array device of this example do not give rise to differences therebetween as compared with those at the striped channels of the conventional Fabry-Pérot laser array device, so that the distributed feedback laser array device is liable to attain laser oscillation with a 0°-phase shift between the adjacent striped channels. Therefore, the distributed feedback laser array device of this invention can maintain a synchronous state of laser lights up to a high electric current level (i.e., high output power) as compared with the conventional laser array device when the amount of injection electric current is increased.

It was observed that the distributed feedback laser array device having three striped channels of this example could attain laser oscillation with a 0°-phase shift between the adjacent channels up to an approximately 80 mW output power. EXAMPLE 2

Figure 2A:
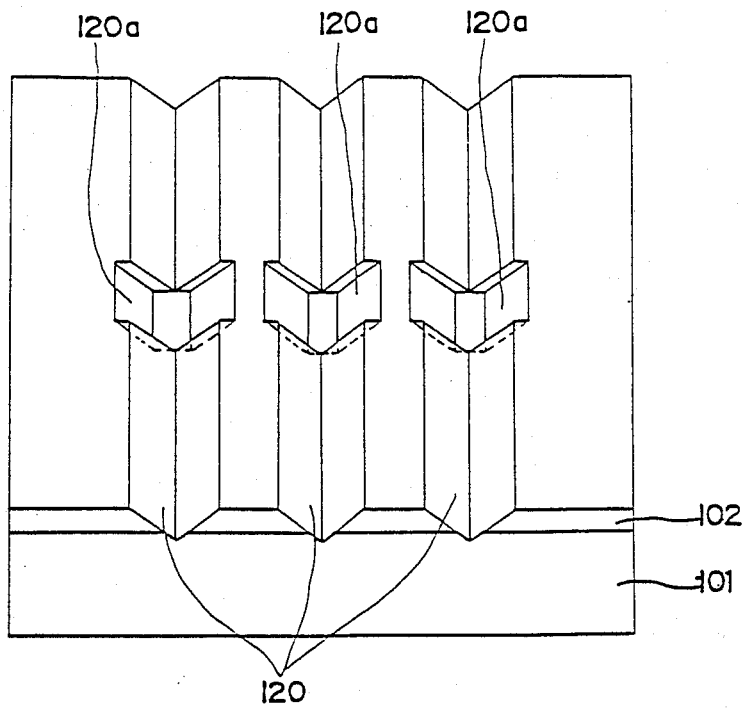
FIG. 2($a$) is a perspective view showing V-channels on the substrate of a semiconductor laser array device of this invention.
Figure 2B:
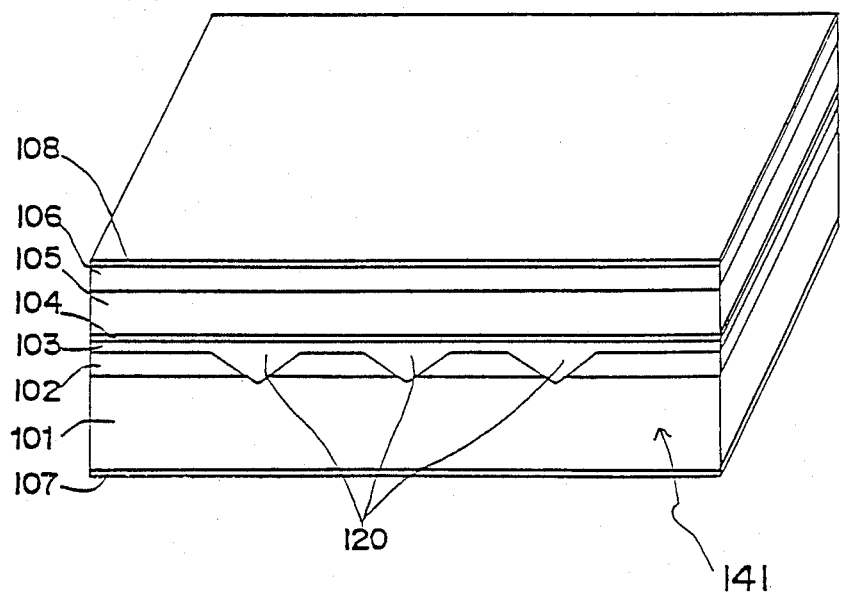
Figure 3:
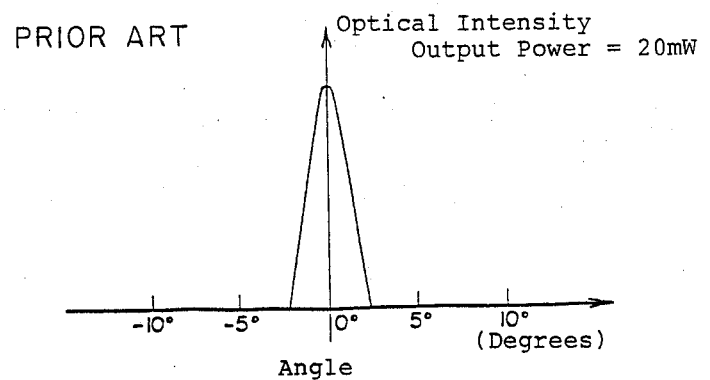
FIG. 3 is a diagram showing the far-field pattern at the time when a conventional semiconductor laser array device attains laser oscillation with a 0°-phae shift between the adjacent striped channels up to a 20 mW output power.
Figure 4:
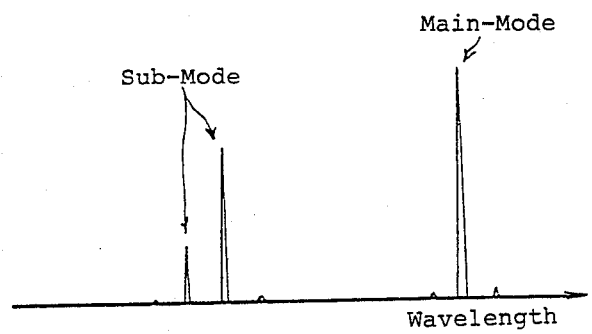
FIG. 4 is a diagram showing the longitudinal mode spectrum in an unsynchronous state created by the conventional semiconductor laser array device shown in FIG. 3 in the range of higher than the 20 mW output power.

FIGS. 2(a) and 2(b) show another semiconductor laser array device having an internal reflection structure, which can be fabricated as follows: On a p+-GaAs substrate 101, an n-GaAs current blocking layer 102 having a thickness of approximately 1.0 μm is grown by liquid phase epitaxy, metal organic-chemical vapor deposition or the like. Then, a plurality of V-channels 120 having a depth of approximately 1.1 μm and a width of 3.5 μm are formed in a parallel manner with the center-to-center spacing of 5.0 μm at the current blocking layer side by photolithography and an etching technique in such a manner that they reach the substrate 101. As shown in FIG. 2(a), each of the V-channels 120 has an enlarged portion 120a with a length of 10 μm and a width of 4.5 μm in the center thereof in the direction which is perpendicular to the V-channels. On the current blocking layer 102 including the V-channels 120, as shown in FIG. 2(b), a p-$Al_uGa_{1-u}$As cladding layer 103, a p- or n-$Al_vGa_{1-v}$As active layer 104, an n-$Al_uGa_{1-u}$As cladding layer 105 and an n+-GaAs contact layer 106 are successively grown by liquid phase epitaxy. By the selection of the growth rate for the p-cladding layer 103, the active layer 104 can be formed into a plane shape. Then, ohmic contacts 107 and 108 are formed on the back face of the substrate 101 and the upper face of the grown layers, respectively. The facets 141, which are at right angles to the V-channels 120, are formed by cleavage to function as laser oscillation faces. The cleavage position must be selected in such a manner that the enlarged portions 120a of the V-channels 120 are not exposed from the facets 141.

The resulting laser array device, in which the individual V-channels 120 function as a single lasing striped channel, has a difference in equivalent refractive index at the interface between each of the striped V-channels 120 and the enlarged portion 120a thereof, causing an internal reflection therein. Thus, the individual V-channels function in the same manner as in a laser device with internal reflection, so that the oscillation wavelength hardly varies with a variation in temperature (or electric current), that is, the laser array device with internal reflection of this example has a structure which allows the attainment of laser oscillation with a 0°-phase shift between the adjacent channels up to a high electric current level (i.e., high output power).

A semiconductor laser array device having a distributed Bragg reflection structure can also attain laser oscillation with a 0°-phase shift between the adjacent channels up to high output power as in Example 1. Such a structure is illustrated in FIG. 1A and may be fabricated in accordance with the description of Example 1 with modifications known to those skilled in the art. Substrate 1a, current blocking layer 2a, V-channels 20a, cladding layer 3a, optical guiding layer 4a, active layer 5a, optical guiding layer 6a, cladding layer 7a, and contact layer 8a are formed exactly as described in Example 1. Portions of contact layer 8a, cladding layer 7a, optical guiding layer 6a, and active layer 5a in region 51 are then removed using conventional photolithography and etching techniques so as to expose optical guiding layer 4a. Periodic grating 30a is then formed on optical guiding layer 4a in the same manner as in Example 1. Ohmic contact 9a is formed over contact layer 8a in region 50 in the same manner as in Example 1. Ohmic contact 10a as well as facets 40a and 41a are also formed in the same manner as in Example 1.

Various modifications of the semiconductor laser array device of this invention include:

(i) Devices which are designed to provide a structure having a different polarity from the polarity of each of the substrate and the grown layers in the above-mentioned examples.

(ii) Devices which are designed using other materials achieving laser oscillation.

(iii) Devices which are designed by the application of semiconductor laser structure to the individual striped-channels of laser array devices.

(iv) Devices which are designed using other structures which minimize the dependence of wavelength in the oscillation longitudinal mode on temperature.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A semiconductor laser array device comprising:
   an array structure which contains a plurality of adjacent striped channels for emitting laser light, wherein the wavelength in the longitudinal mode of said laser light of said striped channels varies only slightly with respect to a variation in temperature, said variation in temperature being proportional to a variation in driving electric current, and wherein said array structure provides for laser oscillation with a zero degrees phase shift between adjacent striped channels up to a high output power, wherein said array structure is a distributed feedback structure.

2. A semiconductor laser array device comprising:
   an array structure which contains a plurality of adjacent striped channels for emitting laser light, wherein the wavelength in the longitudinal mode of said laser light of said striped channels varies only slightly with respect to a variation in temperature, said variation in temperature being proportional to a variation in driving electric current, and wherein said array structure provides for laser oscillation with a zero degrees phase shift between adjacent striped channels up to a high output power, wherein said array structure is a distributed Bragg reflection structure.

3. A semiconductor laser array device comprising:
   an array structure which contains a plurality of adjacent striped channels for emitting laser light, wherein the wavelength in the longitudinal mode of said laser light of said striped channels varies only slightly with respect to a variation in temperature, said variation in temperature being proportional to a variation in driving electric current, and wherein said array structure provides for laser oscillation with a zero degrees phase shift between adjacent striped channels up to a high output power, wherein said array structure is an internal reflection structure.

4. The semiconductor laser array device according to claim 1, wherein said distributed feedback structure has a grating means, wherein said grating means is formed substantially perpendicular to said striped channels.

5. The semiconductor laser array device according to claim 2, wherein said distributed Bragg reflection structure has a grating means, wherein said grating means is formed substantially perpendicular to said striped channels.

6. A semiconductor laser array device comprising:
   an array structure which contains a plurality of adjacent striped channels for emitting laser light, wherein the wavelength in the longitudinal mode of said laser light of said striped channels varies only slightly with respect to a variation in temperature, said variation in temperature being proportional to a variation in driving electric current, and wherein said array structure provides for laser oscillation with a zero degrees phase shift between adjacent striped channels up to a high output power, wherein said array structure includes a grating means common to all of said striped channels.

7. The semiconductor laser array device according to claim 6, wherein said array structure is a distributed feedback structure.

8. The semiconductor laser array device according to claim 6, wherein said array structure is a distributed Bragg reflection structure.

9. The semiconductor laser array device according to claim 6, wherein said array structure is an internal reflection structure.

10. The semiconductor laser array device according to claim 7, wherein said grating means is formed substantially perpendicular to said striped channels.

11. The semiconductor laser array device according to claim 8, wherein said grating means is formed substantially perpendicular to said striped channels.

12. A distributed feedback semiconductor laser array device comprising:
    a substrate;
    a current blocking layer formed on said substrate, said current blocking layer including parallel V-channels formed therein, wherein said V-channels reach said substrate and wherein said V-channels are formed so as to provide for striped channels for emitting laser light;
    a first cladding layer formed on said current blocking layer;
    a first optical guiding layer formed on said first cladding layer;
    an active layer formed on said first optical guiding layer;
    a second optical guiding layer formed on said active layer, said second optical guiding layer including a grating means formed thereon;
    a second cladding layer formed on said second optical guiding layer;
    a contact layer formed on said second cladding layer; and
    first and second ohmic contacts formed on said contact layer and said substrate, respectively;
    wherein the laser light emitted by said semiconductor laser array device varies only slightly with respect to a variation in temperature, said variation in temperature being proportional to a variation in driving electric current, and wherein said semiconductor laser array device provides for laser oscillation with a zero degrees phase shift between adjacent striped channels up to a high output power.

13. An internal reflection semiconductor laser array device comprising:
    a substrate;
    a current blocking layer formed on said substrate, said current blocking layer including parallel V-channels formed therein, wherein said V-channels reach said substrate, said V-channels have enlarged V-shaped portions for causing internal reflection, and said V-channels are formed as to provide for striped channels for emitting laser light;
    a first cladding layer formed on said current blocking layer;
    an active layer on said first cladding layer;
    a second cladding layer formed on said active layer;
    a contact layer formed on said second cladding layer; and
    first and second ohmic contacts formed on said contact layer and said substrate, respectively;
    wherein the laser light emitted by said semiconductor laser array device varies only slightly with respect to a variation in tempertature, said variation in temperature being proportional to a variation in driving electric current, and wherein said semiconductor laser array device provides for laser oscillation with a zero degree phase shift between adjacent striped channels up to a high output power.

14. A distributed Bragg reflection semiconductor laser array device comprising:
   a substrate;
   a current blocking layer formed on said substrate, said current blocking layer including parallel V-channels formed therein, wherein said V-channels reach said substrate and wherein said V-channels are formed so as to provide for striped channels for emitting laser light;
   a first cladding layer formed on said current blocking layer;
   a first optical guiding layer formed on said first cladding layer;
   an active layer formed on said first optical guiding layer;
   a second optical guiding layer formed on said active layer;
   a second cladding layer formed on said second optical guiding layer;
   a contact layer formed on said second cladding layer, wherein portions of said contact layer, said second cladding layer, and said active layer are removed so as to provide an exposed portion of said first optical guiding layer;
   a grating means formed on said exposed portion of said first optical guiding layer; and
   first and second ohmic contacts formed on said contact layer and said substrate, respectively;
   wherein the laser light emitted by said semiconductor laser array device varies only slightly with respect to a variation in temperature, said variation in temperature being proportional to a variation in driving electric current, and wherein said semiconductor laser array device provides for laser oscillation with a zero degrees phase shift between adjacent striped channels up to a high output power.

* * * * *